(12) United States Patent
Piazza et al.

(10) Patent No.: US 11,740,697 B1
(45) Date of Patent: Aug. 29, 2023

(54) VIBROTACTILE DEVICES, SYSTEMS, AND RELATED METHODS

(71) Applicant: META PLATFORMS TECHNOLOGIES, LLC, Menlo Park, CA (US)

(72) Inventors: Daniele Piazza, Redmond, WA (US); Tristan Thomas Trutna, Seattle, WA (US); Charles Stewart, Woodinville, WA (US); David R. Perek, Seattle, WA (US); Adam Ahne, Snohomish, WA (US); Slava Karulin, Redmond, WA (US); Erik Roby, Seattle, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 974 days.

(21) Appl. No.: 16/408,420

(22) Filed: May 9, 2019

Related U.S. Application Data

(60) Provisional application No. 62/749,595, filed on Oct. 23, 2018, provisional application No. 62/687,237, filed on Jun. 19, 2018.

(51) Int. Cl.
*G06F 3/01* (2006.01)
*C30B 29/30* (2006.01)
*G06F 1/16* (2006.01)
*H10N 30/20* (2023.01)
*H10N 30/853* (2023.01)

(52) U.S. Cl.
CPC ............... *G06F 3/016* (2013.01); *C30B 29/30* (2013.01); *G06F 1/163* (2013.01); *G06F 3/014* (2013.01); *H10N 30/204* (2023.02); *H10N 30/8554* (2023.02)

(58) Field of Classification Search
CPC ... H01L 41/0926; H01L 41/1876; G06F 1/163; G06F 3/014; G06F 3/016; C30B 29/30
USPC ........................................................ 310/330
See application file for complete search history.

(56) References Cited

U.S. PATENT DOCUMENTS

| | | | |
|---|---|---|---|
| 5,583,478 | A | 12/1996 | Renzi |
| 7,511,706 | B2 | 3/2009 | Schena |
| 8,294,557 | B1 | 10/2012 | El Saddik et al. |
| 8,300,710 | B2 | 10/2012 | Ryu et al. |

(Continued)

FOREIGN PATENT DOCUMENTS

| | | |
|---|---|---|
| KR | 10-2018-0012673 A | 2/2018 |
| WO | 03/042957 A1 | 5/2003 |

(Continued)

OTHER PUBLICATIONS

International Preliminary Report on Patentability for International Application No. PCT/IB2019/056848, mailed Dec. 30, 2020, 15 Pages.

(Continued)

*Primary Examiner* — Shawki S Ismail
*Assistant Examiner* — Monica Mata
(74) *Attorney, Agent, or Firm* — Greenberg Traurig, LLP

(57) ABSTRACT

The disclosed flexible vibrotactile devices may include a dielectric support material, at least one flexible electroactive element coupled to the dielectric support material, a first conductive electrode material, and a second conductive electrode material. The dielectric support material may include at least one hole therethrough for securing the flexible vibrotactile device to a textile by threading at least one fiber through the at least one hole. Various other related methods and systems are also disclosed.

20 Claims, 14 Drawing Sheets

(56) References Cited

U.S. PATENT DOCUMENTS

| | | |
|---|---|---|
| 8,523,740 B2 | 9/2013 | Kruse et al. |
| 8,992,322 B2 | 3/2015 | Endo et al. |
| 9,001,032 B2 | 4/2015 | Yang et al. |
| 9,030,305 B2 | 5/2015 | Ryu et al. |
| 9,171,437 B2 | 10/2015 | Nakamura et al. |
| 9,323,327 B2 | 4/2016 | Aleksov et al. |
| 9,535,550 B2 | 1/2017 | Levesque et al. |
| 9,600,076 B2 | 3/2017 | Levesque et al. |
| 9,645,647 B2 | 5/2017 | Levesque |
| 9,875,625 B2 | 1/2018 | Khoshkava et al. |
| 9,880,621 B2 | 1/2018 | Israr et al. |
| 10,146,308 B2 | 12/2018 | Cruz-Hernandez et al. |
| 2005/0140249 A1* | 6/2005 | Kita et al. ........... H01L 41/0986 310/359 |
| 2007/0146317 A1 | 6/2007 | Schena |
| 2010/0141407 A1 | 6/2010 | Heubel et al. |
| 2010/0231505 A1 | 9/2010 | Iwata |
| 2011/0148607 A1 | 6/2011 | Zeleny |
| 2013/0026021 A1* | 1/2013 | Hori et al. ............ H01L 41/318 29/25.35 |
| 2014/0070957 A1 | 3/2014 | Longinotti-Buitoni et al. |
| 2015/0009168 A1 | 1/2015 | Levesque et al. |
| 2016/0274662 A1 | 9/2016 | Rimon et al. |
| 2016/0321880 A1 | 11/2016 | Hamam et al. |
| 2017/0168576 A1 | 6/2017 | Keller et al. |
| 2017/0212769 A1 | 7/2017 | Yang |
| 2018/0120938 A1 | 5/2018 | Frescas et al. |
| 2018/0131347 A1* | 5/2018 | Rhee et al. ........ H01L 41/1132 |
| 2018/0193879 A1* | 7/2018 | Morita ................ B06B 1/0629 |
| 2018/0342176 A1 | 11/2018 | Califormiaa |
| 2019/0132948 A1* | 5/2019 | Longinotti-Buitoni et al. ............ D06P 1/5285 |

FOREIGN PATENT DOCUMENTS

| | | |
|---|---|---|
| WO | 2012/047626 A1 | 4/2012 |
| WO | 2016/207751 A1 | 12/2016 |
| WO | 2018/183163 A1 | 10/2018 |
| WO | 2018/194884 A1 | 10/2018 |

OTHER PUBLICATIONS

International Search Report and Written Opinion received for PCT Application Serial No. PCT/IB20191056848 dated Dec. 4, 2019, 18 pages.

* cited by examiner

VIBROTACTILE DEVICES, SYSTEMS, AND RELATED METHODS

CROSS REFERENCE TO RELATED APPLICATIONS

This application claims the benefit of U.S. Provisional Patent Application No. 62/687,237, filed Jun. 19, 2018, and U.S. Provisional Pat. Application No. 62/749,595, filed Oct. 23, 2018, the disclosure of each of which is incorporated, in its entirety, by this reference.

BACKGROUND

Vibrotactile devices include devices that may vibrate to provide haptic feedback to a user of a device. For example, some modern mobile devices (e.g., cell phones, tablets, mobile gaming devices, gaming controllers, etc.) include a vibrotactile device that informs the user through a vibration that an action has been taken. The vibration may indicate to the user that a selection has been made or a touch event has been sensed. Vibrotactile devices may also be used to provide an alert or signal to the user.

Various types of vibrotactile devices exist, such as piezoelectric devices, eccentric rotating mass devices, and linear resonant actuators. Such conventional vibrotactile devices may include one or more elements that vibrate upon application of an electrical voltage. In the case of piezoelectric devices, an applied voltage may induce bending or other displacement in a piezoelectric material. Eccentric rotating mass devices induce vibration by rotating an off-center mass around an axle of an electromagnetic motor. Linear resonant actuators may include a mass on an end of a spring that is driven by a linear actuator to cause vibration. Many of these conventional vibrotactile devices are rigid and inflexible.

SUMMARY

As will be described in greater detail below, the present disclosure describes flexible vibrotactile devices, systems including such devices, and related methods. For example, the flexible vibrotactile devices may include at least one hole therethrough for securing the devices to a textile.

In some embodiments, the present disclosure describes flexible vibrotactile devices that include a dielectric support material, at least one flexible electroactive element coupled to the dielectric support material, a first conductive electrode material, and a second conductive electrode material. The dielectric support material may include at least one hole therethrough for securing the flexible vibrotactile device to a textile by threading at least one fiber through the at least one hole. The first conductive electrode material may be positioned adjacent to and in electrical contact with a first side of the at least one flexible electroactive element. The second conductive electrode material may be positioned adjacent to and in electrical contact with a second side of the at least one flexible electroactive element opposite the first side. The first and second conductive electrode materials may be configured to apply a voltage across, and to induce movement in, the at least one flexible electroactive element.

In one example, the at least one flexible electroactive element may include a first flexible electroactive element and a second flexible electroactive element that together define a bimorph structure. The first conductive material may be positioned adjacent to a first side of the first flexible electroactive element and the second conductive electrode material may be a common electrode positioned adjacent to a second, opposite side of the first flexible electroactive element and between the first flexible electroactive element and the second flexible electroactive element. The flexible vibrotactile device may also include a third conductive electrode material that is positioned adjacent to a side of the second flexible electroactive element opposite the second conductive electrode material and opposite the first flexible electroactive element. In additional examples, the first conductive electrode may be positioned adjacent to a first side of the first flexible electroactive element, and the second conductive electrode material may be positioned adjacent to a second, opposite side of the first flexible electroactive element and between the first flexible electroactive element and the second flexible electroactive element. The flexible vibrotactile device may further include a third conductive electrode material positioned adjacent to a first side of the second flexible electroactive element and between the first flexible electroactive element and the second flexible electroactive element, a fourth conductive electrode material positioned adjacent to a second, opposite side of the second flexible electroactive element, and a central insulating material positioned between the second conductive electrode material and the third conductive electrode material. A first insulating material may be positioned over the first electrode material to provide a protective coating over the first electrode material, and a second insulating material may be positioned over the second electrode material to provide a protective coating over the second electrode material. Each of the first flexible electroactive element and the second flexible electroactive element may have a thickness of about 150 µm or less.

In some examples, the at least one flexible electroactive element may include at least one of: an electroactive polymer material; a dielectric elastomer material; a relaxor ferroelectric material; a piezoelectric ceramic material; or a piezoelectric single-crystal material. For example, the at least one flexible electroactive element may include lead zirconate titanate (PZT). In another example, the at least one flexible electroactive element may include lead magnesium niobite-lead titanate (PMN-PT). Each of the first and second conductive electrode materials may include copper. The at least one flexible electroactive element may include a plurality of strips of flexible electroactive material positioned adjacent to and parallel to each other. The dielectric support material may have a rectangular shape with at least two rounded corners to facilitate positioning at least a portion of the flexible vibrotactile device within a pocket of the textile. The at least one hole through the dielectric support material may include at least one upper hole through an upper portion of the dielectric support material and at least one lower hole through a lower portion of the dielectric support material on an opposite side of the at least one flexible electroactive element from the at least one upper hole.

In some examples, the flexible vibrotactile device may also include a first conductive terminal for providing electrical access to the first conductive electrode material, and a second conductive terminal for providing electrical access to the second conductive electrode material. The device may have a thickness of about 0.29 mm or less.

In some embodiments, the present disclosure includes vibrotactile systems that include a flexible wearable textile material, a flexible vibrotactile device, a power source, and a communications interface. The flexible wearable textile material may be shaped and configured for positioning against a body part of a user of the vibrotactile system. The flexible wearable textile may include at least one pocket. The flexible vibrotactile device may be coupled to the flexible wearable textile material and positioned at least partially within the at least one pocket to apply a vibration to the body part of the user when in use. The flexible vibrotactile device may include a dielectric support material including at least one hole therethrough, at least one flexible electroactive element coupled to the dielectric support material, and a first conductive electrode material and a second conductive electrode material. The dielectric support material may be secured to the flexible wearable textile via a fiber threaded through the at least one hole. The first and second conductive electrode materials may be positioned and configured to apply a voltage across the at least one flexible electroactive element to induce movement in the at least one flexible electroactive element. The power source may be electrically coupled to at least one of the first conductive electrode or the second conductive electrode to apply the voltage. The communications interface may be in electrical communication with the power source to direct application of the voltage across the at least one flexible electroactive element upon receipt of an activation signal through the communications interface.

In some examples, the flexible wearable textile material may include at least one of: a glove; a headband; a wristband; an armband; a sleeve; a head covering; a sock; a shirt; or pants. The at least one flexible electroactive element may include an array of flexible electroactive elements positioned to apply vibrations to different respective portions of the body part of the user of the vibrotactile system. The system may also include another flexible vibrotactile device coupled to the flexible wearable textile material in a location to apply a vibration to another body part of the user of the vibrotactile system that is different from the body part associated with the flexible vibrotactile device.

In some embodiments, the present disclosure includes methods of forming a flexible vibrotactile device. In accordance with such methods, a dielectric support material may be formed to include at least one hole therethrough for securing the flexible vibrotactile device to a textile by threading at least one fiber through the at least one hole. At least one flexible electroactive element may be coupled to the dielectric support material. A first conductive electrode material may be electrically coupled to a first surface of the at least one flexible electroactive element. A second conductive electrode material may be electrically coupled to a second, opposite surface of the at least one flexible electroactive element to enable application of a voltage across the at least one flexible electroactive element via the first and second conductive electrode materials.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
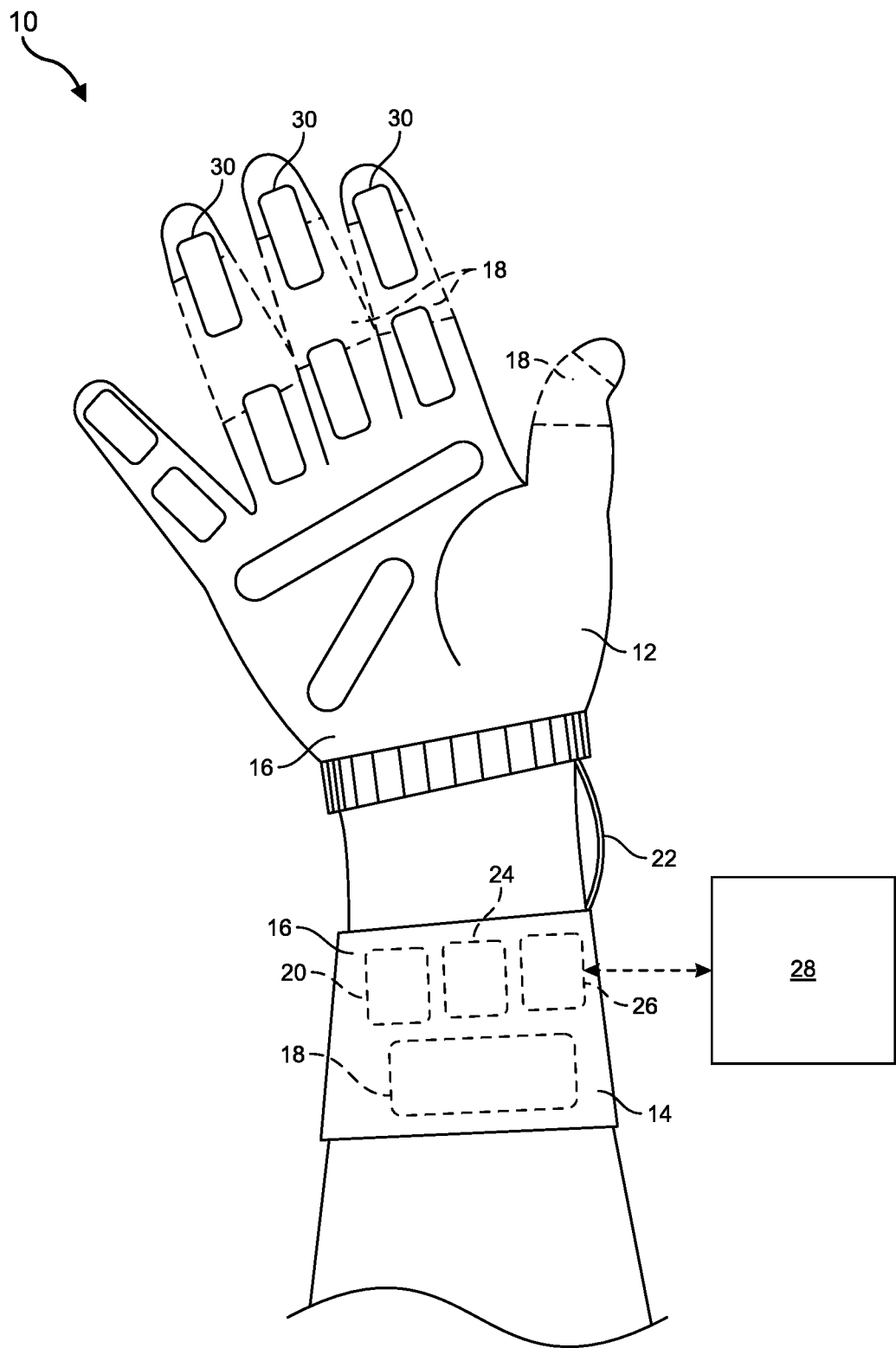
FIG. 1 is a side perspective view of a vibrotactile system according to embodiments of the present disclosure.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE EMBODIMENTS

The present disclosure is generally directed to flexible vibrotactile devices, systems, and methods. As described in greater detail below, the devices and systems may include two plates that are sandwiched together. The plates may include two electroactive elements, such as in the form of piezoelectric plates, that are driven with two respective waveforms that are 180-degree phase-shifted from each other. In another example, only one of the plates is an electroactive, driven material, and the other plate is an inactive material with a selected geometry and mechanical properties to achieve a desired bending displacement. Embodiments of the disclosure may be configured to conform to human body parts (e.g., fingers, wrists, heads, legs, torsos, etc.), while achieving a desired mechanical output. These abilities may be achieved by using materials (e.g., piezoelectric ceramics) with a sufficient piezoelectric coefficient to achieve the desired mechanical output.

Figure 8:
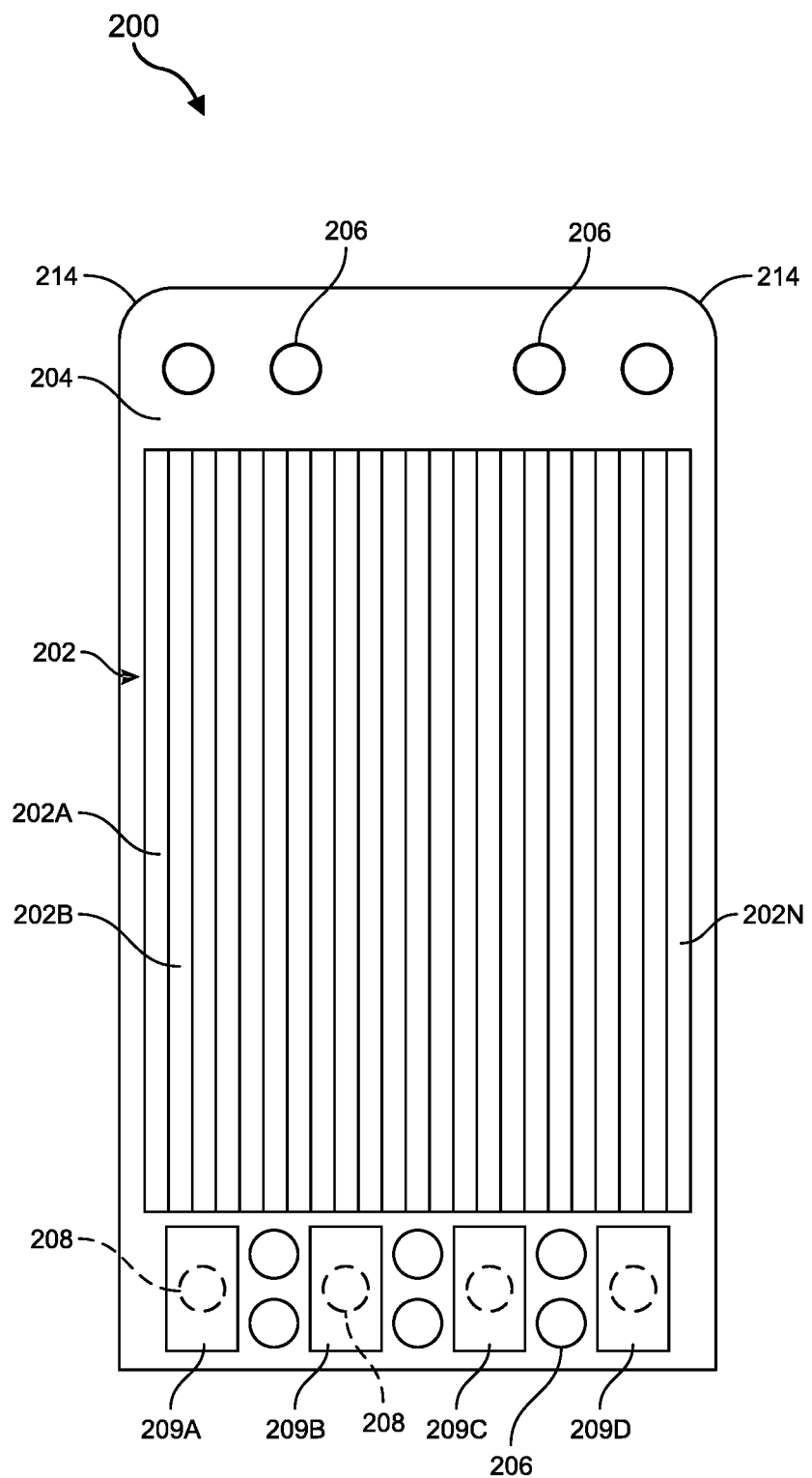
FIG. 8 is a top plan view of a vibrotactile device according to an embodiment of the present disclosure.
Figure 9:
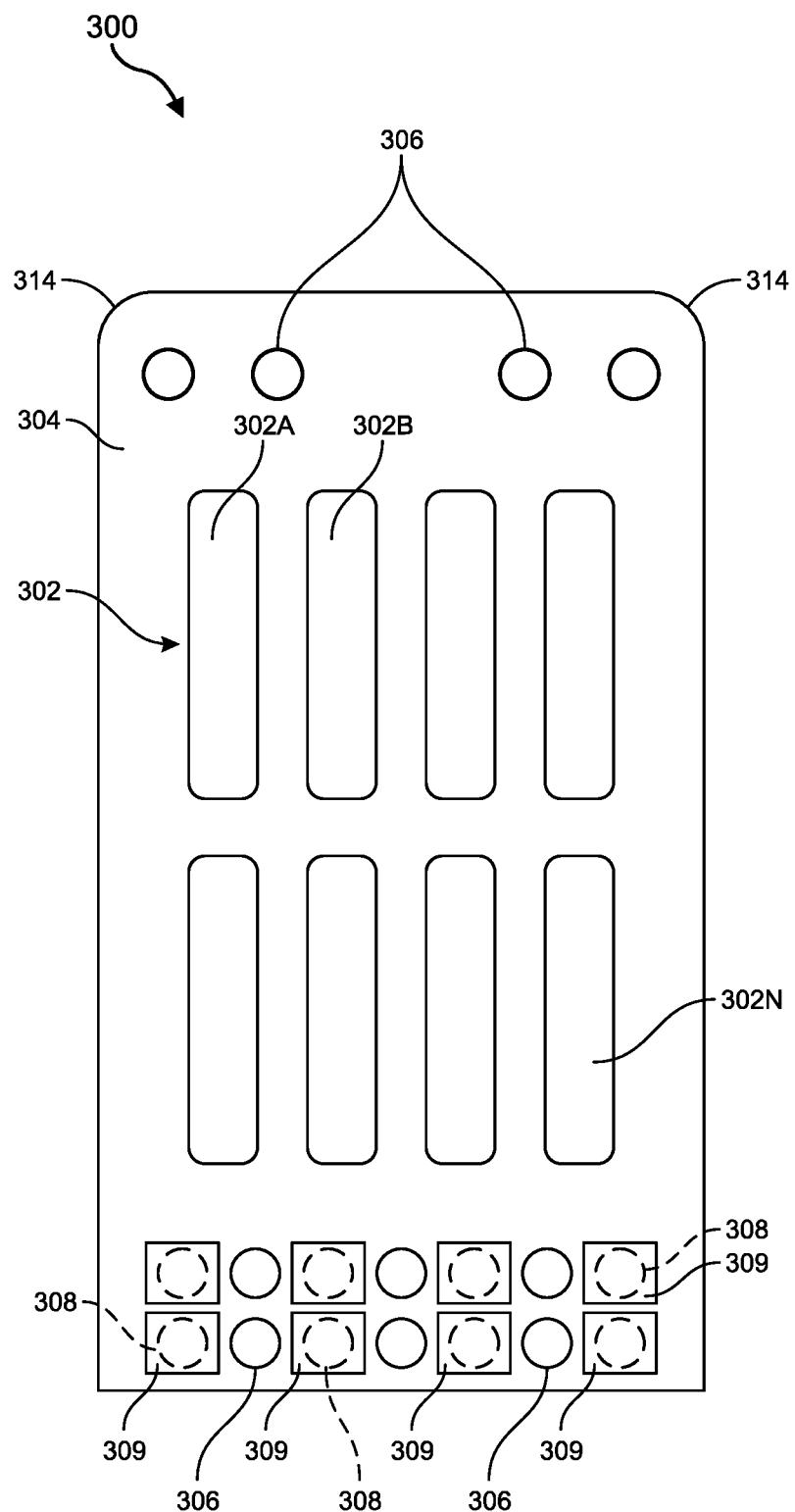
FIG. 9 is a top plan view of a vibrotactile device according to another embodiment of the present disclosure.
Figure 10:
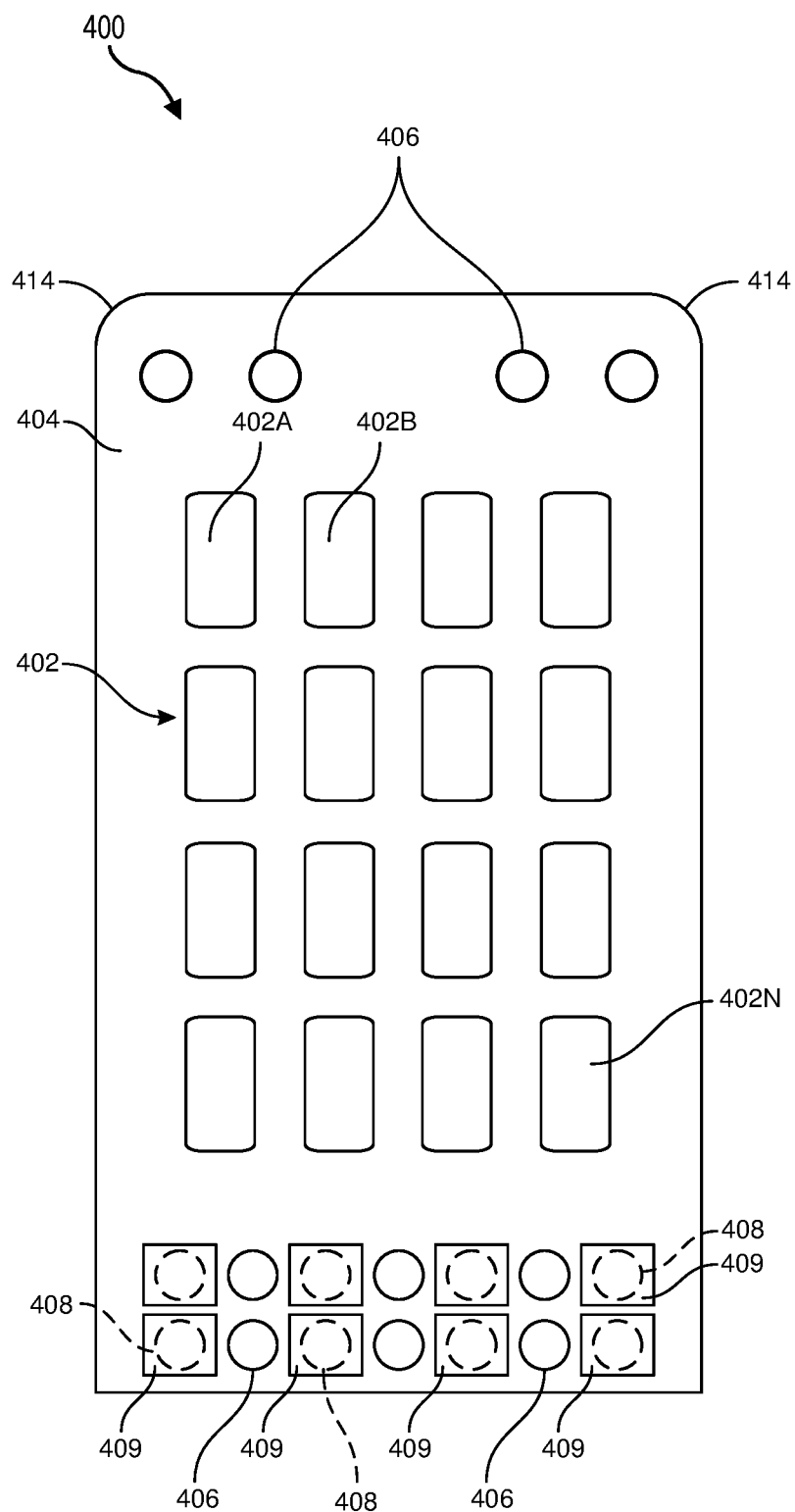
FIG. 10 is a top plan view of a vibrotactile device according to an additional embodiment of the present disclosure.
Figure 11:
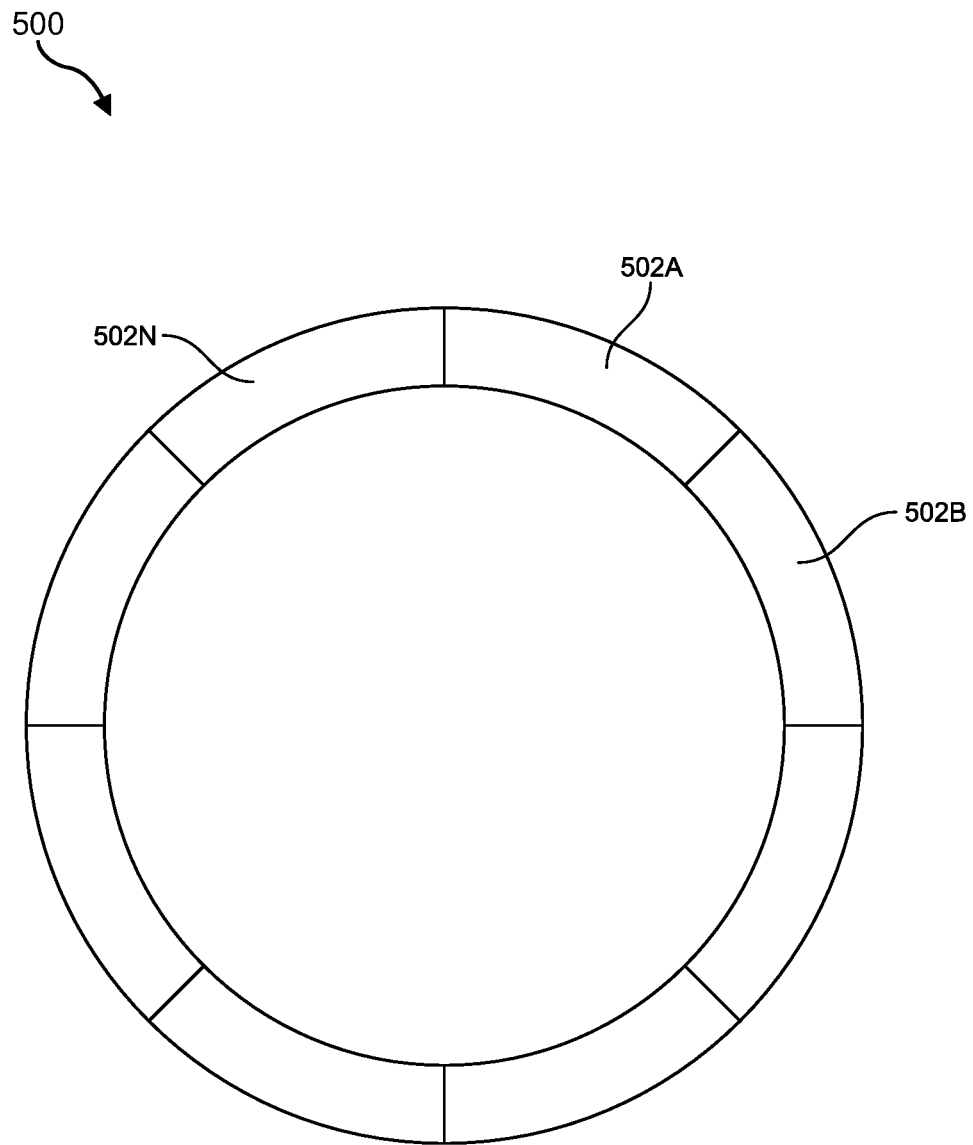
FIG. 11 is a cross-sectional view of a vibrotactile device according to another embodiment of the present disclosure.

The following will provide, with reference to FIG. 1, detailed descriptions of an example vibrotactile system in the form of a wearable glove and wristband. Detailed descriptions of example head-mounted displays and near-eye displays with which systems and devices of the present disclosure may be implemented are provided with reference to FIGS. 2 and 3, respectively. Detailed descriptions of an example vibrotactile device are provided with reference to FIGS. 4-7. With reference to FIGS. 8-10, various alternative embodiments of vibrotactile devices will be described. With reference to FIG. 11, detailed descriptions of an example method of forming flexible vibrotactile devices are provided.

FIG. 1 illustrates a vibrotactile system 10 in the form of a wearable glove 12 and wristband 14. The wearable glove 12 and wristband 14 are shown as examples of wearable devices that include a flexible, wearable textile material 16 that is shaped and configured for positioning against a user's hand and wrist, respectively. The disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 18 may be positioned at least partially within one or more corresponding pockets formed in the textile material 16 of the vibrotactile system 10. The vibrotactile devices 18 may be positioned in locations to provide a vibrating sensation (e.g., haptic feedback) to a user of the vibrotactile system 10. For example, the vibrotactile devices 18 may be positioned to be against the user's finger(s), thumb, or wrist, as shown in FIG. 1. The vibrotactile devices 18 may, in some examples, be sufficiently flexible to conform to or bend with the user's corresponding body part(s).

A power source 20 (e.g., a battery) for applying a voltage to the vibrotactile devices 18 for activation thereof may be electrically coupled to the vibrotactile devices 18, such as via conductive wiring 22. In some examples, each of the vibrotactile devices 18 may be independently electrically coupled to the power source 20 for individual activation. In some embodiments, a processor 24 may be operatively coupled to the power source 20 and configured (e.g., programmed) to control activation of the vibrotactile devices 18.

The vibrotactile system 10 may be a standalone system with integral subsystems and components for operation independent of other devices and systems, or the vibrotactile system 10 may be configured for interaction with another device or system 28. For example, the vibrotactile system 10 may, in some examples, include a communications interface 26 for receiving and/or sending signals to the other device or system 28. The other device or system 28 may be a mobile device, a gaming console, an artificial reality (e.g., virtual reality, augmented reality, mixed reality) device, a personal computer, a tablet computer, a network device (e.g., a modem, a router, etc.), a handheld controller, etc. The communications interface 26 may enable communications between the vibrotactile system 10 and the other device or system 28 via a wireless (e.g., Wi-Fi, Bluetooth, cellular, radio, etc.) link or a wired link. If present, the communications interface 26 may be in communication with the processor 24, such as to provide a signal to the processor 24 to activate or deactivate one or more of the vibrotactile devices 18.

The vibrotactile system 10 may optionally include other subsystems and components, such as touch-sensitive pads 30, pressure sensors, motion sensors, position sensors, lighting elements, and/or user interface elements (e.g., an on/off button, a vibration control element, etc.). During use, the vibrotactile devices 18 may be configured to be activated for a variety of different reasons, such as in response to the user's interaction with user interface elements, a signal from the motion or position sensors, a signal from the touch-sensitive pads 30, a signal from the pressure sensors, a signal from the other device or system 28, etc.

Although the power source 20, processor 24, and communications interface 26 are illustrated in FIG. 1 as being positioned in the wristband 14, the present disclosure is not so limited. For example, one or more of the power source 20, processor 24, or communications interface 26 may be positioned within the glove 12 or within another wearable textile.

Figure 2:
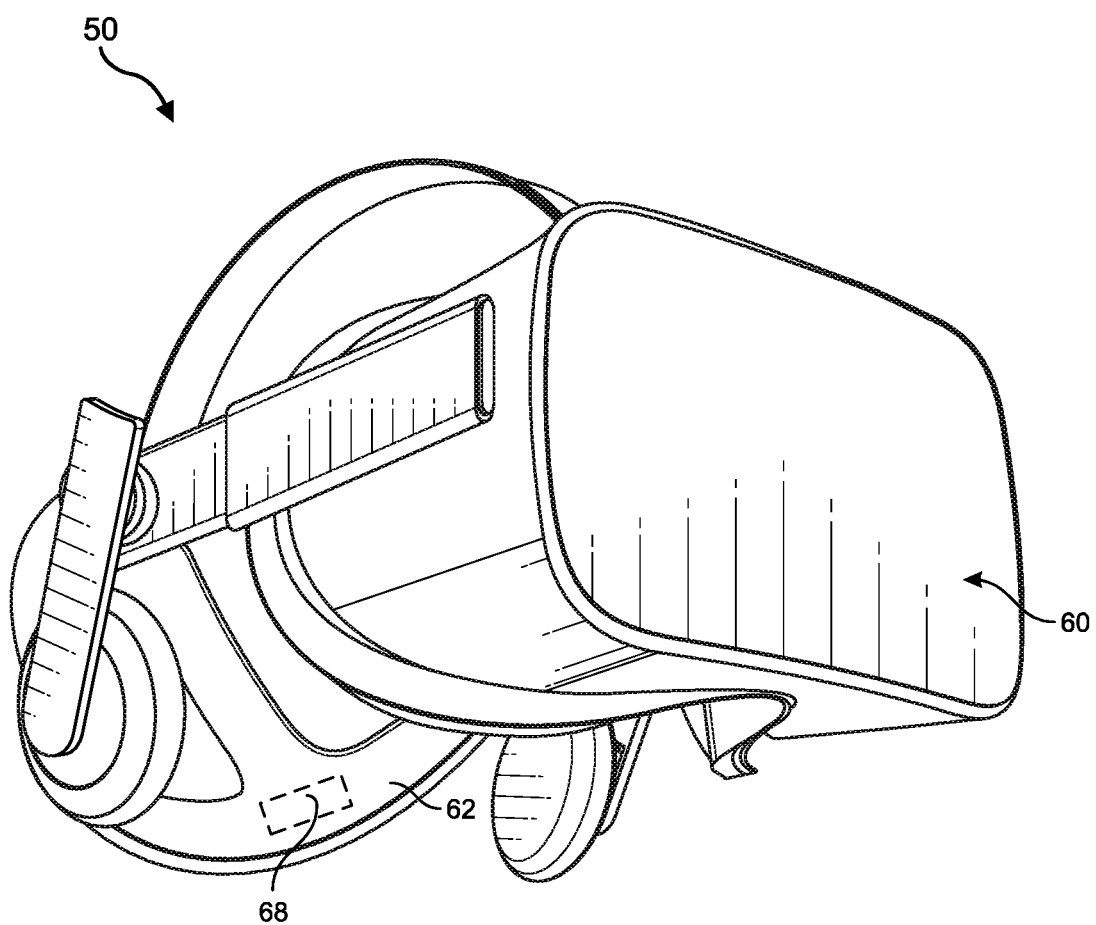
FIG. 2 is a perspective view of an example head-mounted display with which the example vibrotactile systems and devices of the present disclosure may be employed.

FIG. 2 is a perspective view of an example head-mounted display (HMD) 50 that may present images to the eyes of a user as part of an artificial reality (e.g., virtual reality, augmented reality, or mixed reality) system. To present these images, the HMD 50 may, in some embodiments, include at least one example display system 60, which may include optical subsystems (e.g., lenses, focal adjustment subsystems, etc.) and display subsystems (e.g., projectors, reflectors, image combiner lenses, waveguides, display screens, etc.). In some embodiments, two separate display systems 60, one per eye of the user, may be incorporated in the HMD 50. The HMD 50 may include a flexible vibrotactile device 68, such as integrated into a headband 62 thereof. Alternatively or additionally, the HMD 50 may be in communication with another vibrotactile system, such as the system 10 described above and shown in FIG. 1, for example. In one example, the HMD 50 may present an image to the user via the display system 60, and the user may use the vibrotactile system 10 to manipulate (e.g., hold, make a selection, move, touch, etc.) a virtual object displayed in the image. The vibrotactile system 10 may provide haptic feedback to the user in the form of vibrations induced by the one or more vibrotactile devices 18 (FIG. 1), such as to indicate a tactile confirmation to the user that the virtual object has been manipulated.

Figure 3:
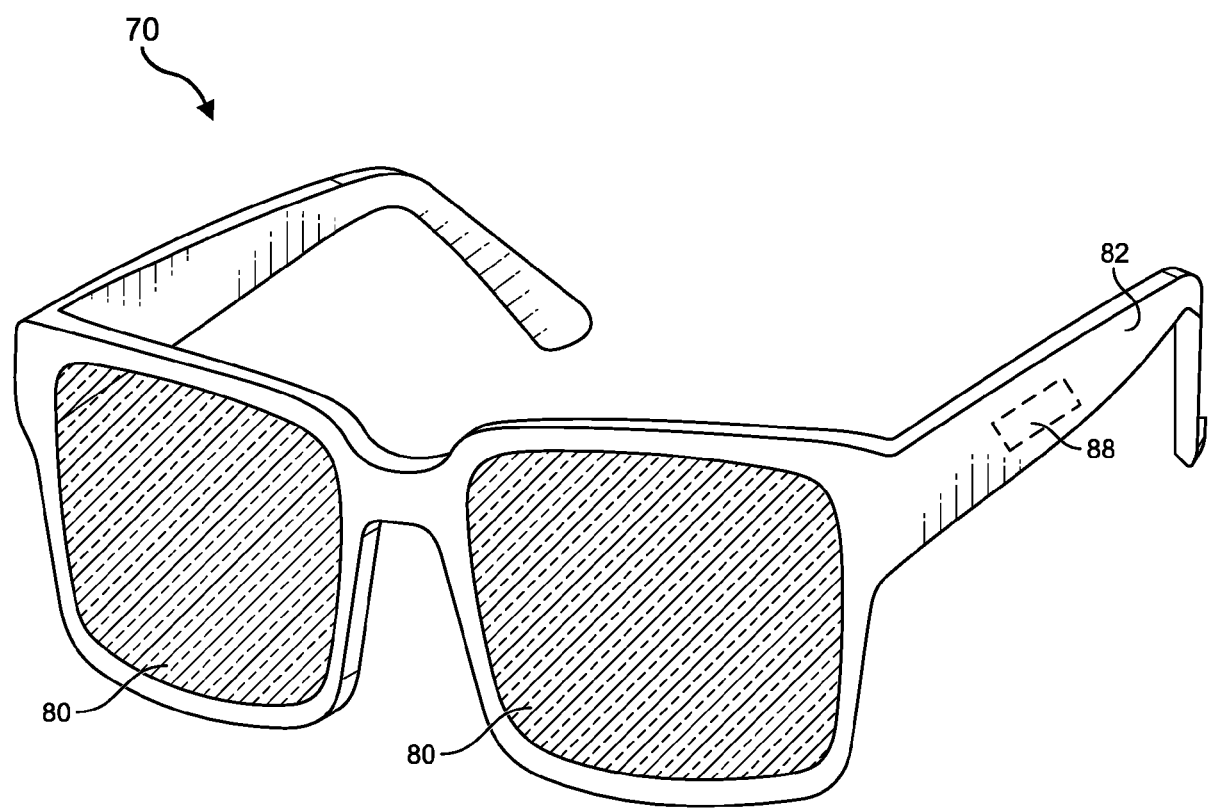
FIG. 3 is a perspective view of an example near-eye display with which the example vibrotactile systems and devices of the present disclosure may be employed.

FIG. 3 is a perspective view of an example near-eye display (NED) 70 that may present images to the eyes of a user as part of an artificial reality system. To present these images, the NED 70 may, in some embodiments, include at least one example display system 80, which may include optical subsystems (e.g., lenses, focal adjustment subsystems, etc.) and display subsystems (e.g., projectors, reflectors, image combiner lenses, waveguides, display screens, etc.). In some embodiments, two separate display systems 80, one per eye of the user, may be incorporated in the NED 70. The NED 70 may include a flexible vibrotactile device 88, such as integrated into an eyeglass frame temple 82 thereof. Alternatively or additionally, the NED 70 may be in communication with another vibrotactile system, such as the system 10 described above and shown in FIG. 1, for example. In one example, the NED 70 may present an image to the user via the display system 80, and the user may use the vibrotactile system 10 to manipulate (e.g., hold, make a selection, move, touch, etc.) a virtual object displayed in the image. The vibrotactile system 10 may provide haptic feedback to the user in the form of vibrations induced by the one or more vibrotactile devices 18 (FIG. 1), such as to indicate a tactile confirmation to the user that the virtual object has been manipulated.

FIGS. 4-7 illustrate various views of an embodiment of a flexible piezoelectric vibrotactile device 100. For example, the vibrotactile device 100 may be implemented in the vibrotactile system 10 of FIG. 1 as one or more of the vibrotactile devices 18, in the HMD 50 of FIG. 2 as the flexible vibrotactile device 68, or in the NED 70 of FIG. 3 as the flexible vibrotactile device 88.

Figure 4:
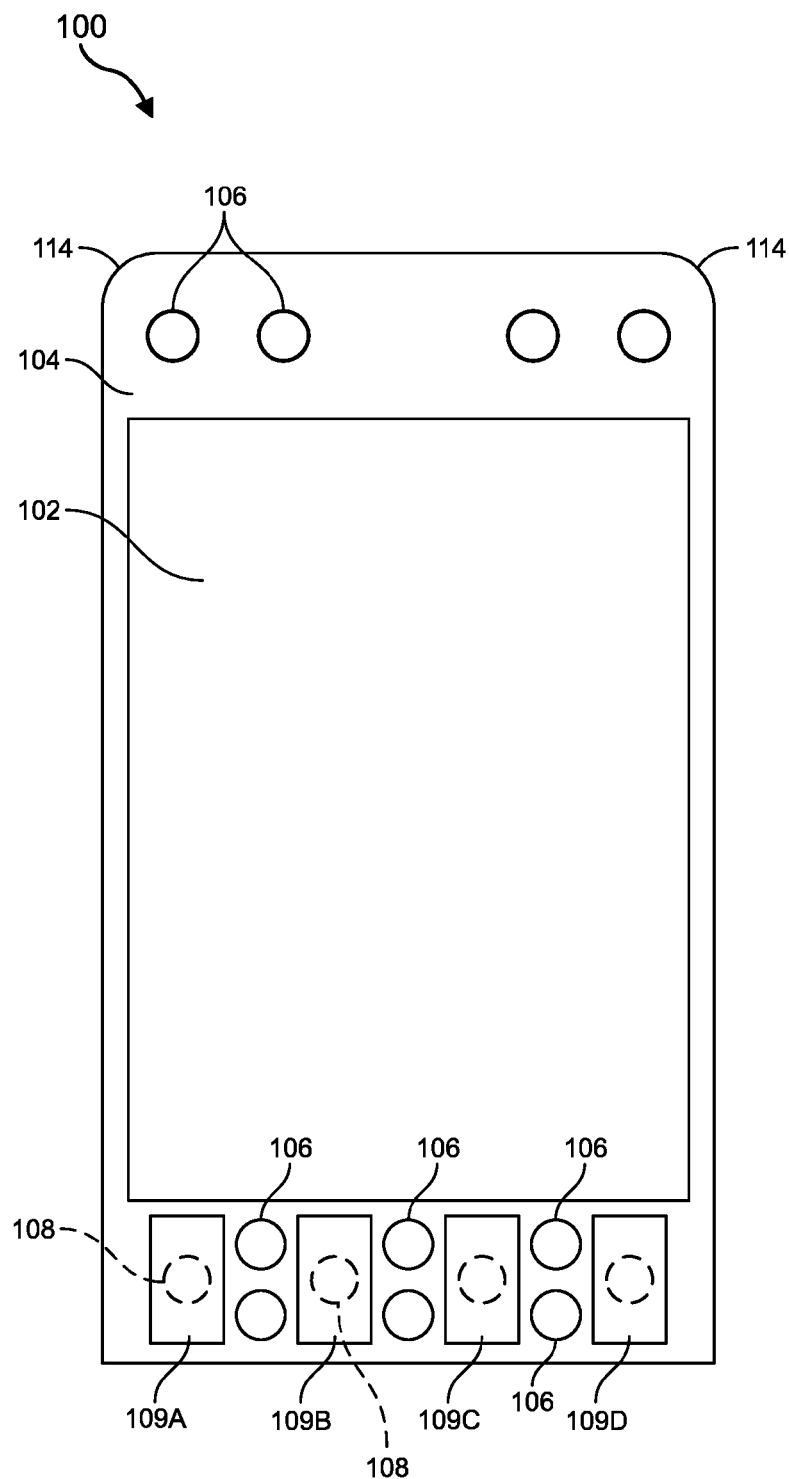
FIG. 4 is a top plan view of a vibrotactile device according to additional embodiments of the present disclosure.
Figure 5:
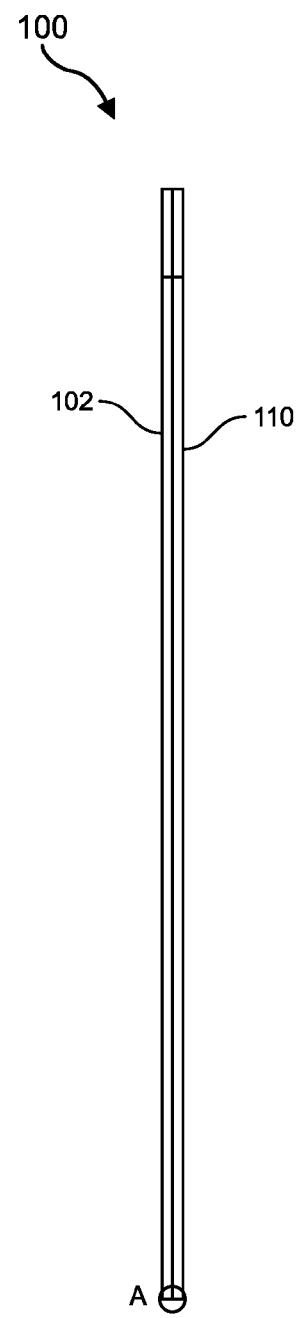
FIG. 5 is a side view of the vibrotactile device of FIG. 4.
Figure 6:
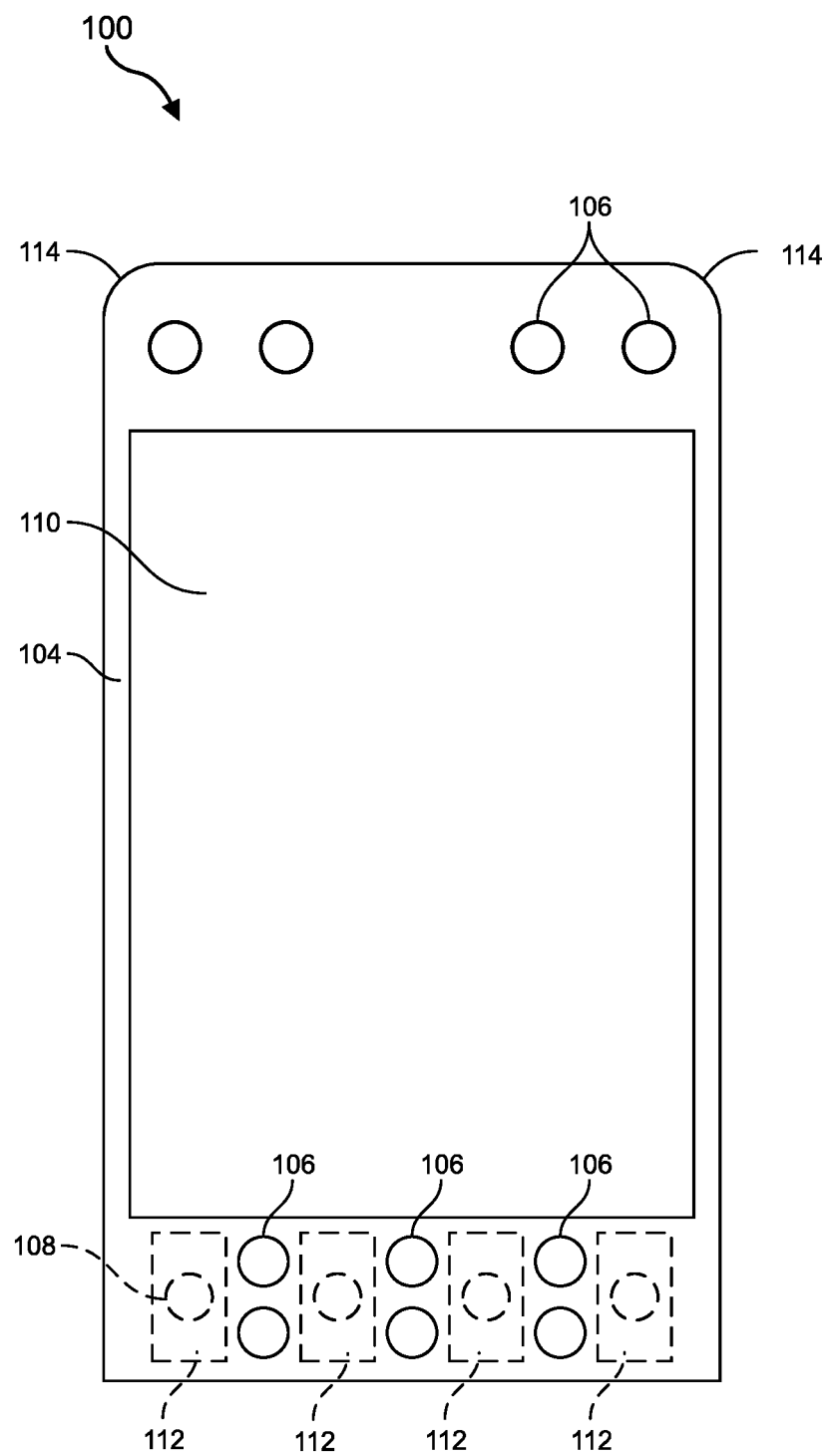
FIG. 6 is a bottom plan view of the vibrotactile device of FIG. 4.

FIG. 4 is a top plan view of the vibrotactile device 100 (also referred to simply as "device 100"). FIG. 5 is a side view of the vibrotactile device 100. FIG. 6 is a bottom view of the vibrotactile device.

Referring to FIGS. 4-6, the device 100 may include a top plate 102 and a bottom plate 110 on an opposite side of the device 100. At least one of the top plate 102 or the bottom plate 110 may include an electroactive (e.g., piezoelectric) material configured to provide haptic feedback (e.g., vibration) upon activation. For example, the device 100 may be configured to be activated, such as by application of a voltage across the top electroactive element 102, in response to touching of the device 100 or interaction with another device or system incorporating the vibrotactile device 100 by a user or against a surface.

As used herein, any relational term, such as "first," "second," "upper," "lower," "top," "bottom," " over," etc., is used for clarity and convenience in understanding the disclosure and accompanying drawings and does not connote or depend on any specific preference, orientation, or order, except where the context clearly indicates otherwise.

In some embodiments, both the top plate 102 and the bottom plate 110 may include respective electroactive materials. In this case, the assembly of the top plate 102 and the bottom plate 110 may define a so-called "bimorph" structure, since there are two adjacent electroactive, driven materials. The top plate 102 may be configured to be driven by a first electrical voltage, and the bottom plate 110 may be configured to be driven by a second electrical voltage having a waveform that is 180-degree phase-shifted from the first electrical voltage.

In additional embodiments, only one of the top plate 102 or the bottom plate 110 may include an electroactive material and may be configured to induce vibrations. The other, inactive plate 102 or 110 may be a structural material (e.g., a dielectric material) that may provide structural support and resistance to bending for the other electroactive plate 102 or 110. In such embodiments, the assembly of the top plate 102 and the bottom plate 110 may define a so-called "unimorph" structure, since there is only one electroactive, driven plate. The unimorph structure may be configured and selected to achieve a desired bending displacement and/or response to activation of the device 100. The device 100 may be selected to have a bimorph structure or a unimorph structure for a given system in view of constraints such as a desired mechanical output, a size, a desired mechanical flexibility, cost, etc.

The device 100 may also include at least one dielectric (e.g., electrically insulating) support material 104 to which the top plate 102 and bottom plate 110 are mounted. Mounting holes 106 may extend through at least the support material 104. In some examples, the mounting holes 106 may be provided for securing the device 100 to a textile (e.g., to the textile material 16 of the vibrotactile system 10 of FIG. 1), such as by threading at least one fiber (e.g., a thread) through the mounting holes 106. A diameter of each of the holes may be selected to facilitate insertion of the fiber therethrough. By way of example and not limitation, the diameter may be about 1.0 mm or less, such as about 0.9 mm.

Conductive terminals 108 may also be mounted to the support material 104. The conductive terminals 108 may provide electrical access to respective conductive electrode materials 109A, 109B, 109C, and 109D (collectively referred to as conductive electrode materials 109), such as for applying an electrical voltage to components (e.g., to the top plate 102 and/or the bottom plate 110) of the device 100 for activation. Although FIGS. 4 and 6 illustrate four conductive terminals 108, a device 100 with a unimorph construction may have only two conductive terminals 108 and respective conductive electrode materials 109 for activating the device 100.

FIGS. 4 and 6 illustrate four upper mounting holes 106 and six lower mounting holes 106 on a side of the top plate 102 and bottom plate 110 opposite the upper mounting holes 106, but this disclosure is not so limited. In other embodiments, the device 100 may include any number of (e.g., at least one, at least two, etc.) mounting holes 106, depending on a shape, size, intended use, and/or configuration of the device 100 or a system incorporating the device 100. Additionally, not all of the mounting holes 106 that are provided in the device 100 may be used for threading and securing the device 100 to a textile. For example, wiring extending from the conductive terminals 108 may pass through one or more of the mounting holes 106 to provide stress relief at a connection between the conductive terminals 108 and respective wiring. Alternatively, one or more of the mounting holes 106 may be present in the device 100, but not used in an associated system.

As shown in FIG. 6, a bottom side of the conductive materials 109 may be electrically insulated by a terminal insulating material 112, shown as dashed boxes in FIG. 6. In some embodiments, the terminal insulating material 112 may be an integral portion of the dielectric material 104.

Referring to FIGS. 4 and 6, the device 100 may have an initial (e.g., unbent) shape that is generally rectangular. By way of example and not limitation, a length of the device 100 may be about 20 mm and a width of the device 100 may be about 11 mm. Of course, the size of the device 100 may be selected based on a given application and may be smaller or larger than the example dimensions given. In some embodiments, the shape of the device 100 may be trapezoidal, ovular, circular, triangular, irregular, etc. The shape of the device 100 may be selected to fit against a particular human body part and/or to provide a desired vibrotactile signal to the user. In some examples, the device 100 may have at least two rounded corners 114. The rounded corners 114 may facilitate insertion of the device 100 into a pocket formed in a textile material by inhibiting catching of the device 100 on the textile material during insertion. In one example, the rounded corners 114 may each have a radius of about 1.0 mm.

Figure 7:
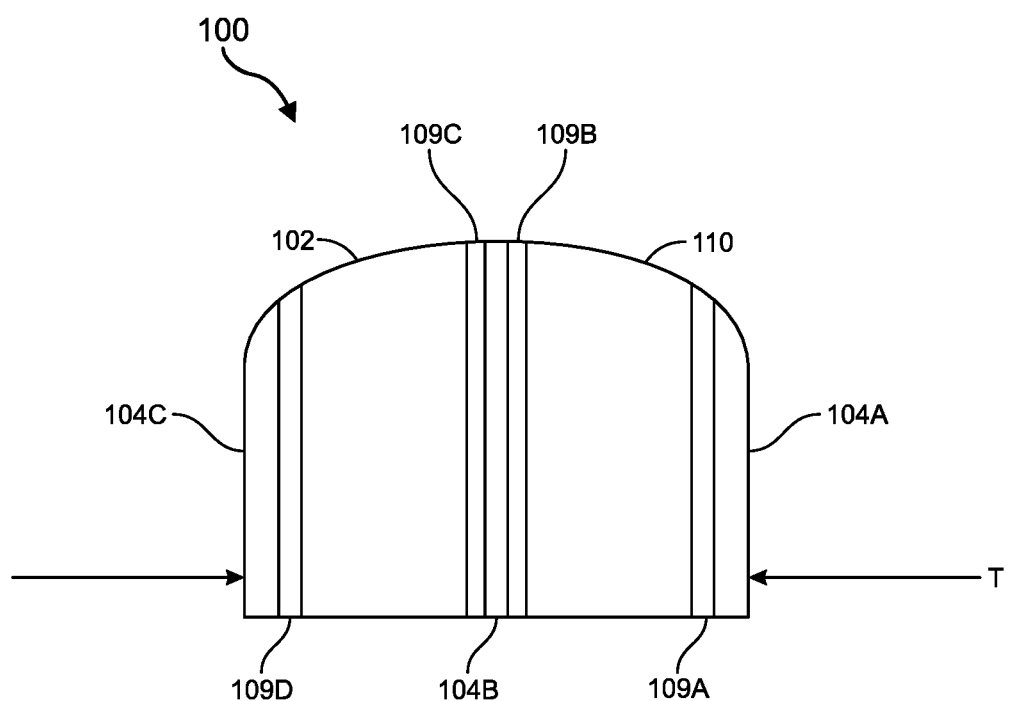
FIG. 7 is a detailed cross-sectional view of a portion of the vibrotactile device of FIG. 4 identified at circle A of FIG. 5.

FIG. 7 is a detailed cross-sectional view of a portion of the vibrotactile device 100 identified at circle A of FIG. 5, with each of the top plate 102 and the bottom plate 110 including an electroactive material to define a bimorph structure. In the view shown in FIG. 7, sequentially proceeding from the right to the left of the device 100, the device 100 may include a bottom insulating material 104A, a first conductive electrode material 109A, the bottom piezoelectric element 110, a second conductive electrode material 109B, a central insulating material 104B, a third conductive electrode material 109C, the top plate 102, a fourth conductive electrode material 109D, and a top insulating material 104C. The first and second conductive electrode materials 109A and 109B may be positioned and configured to apply a voltage across the bottom plate 110. The third and fourth conductive materials 109C and 109D may be positioned and configured to apply a voltage across the top plate 102. The central insulating material 104B may be positioned to electrically insulate the second and third conductive materials 109B and 109C from each other. The bottom and top insulating materials 104A and 104C may be positioned to provide a protective coating over the first and fourth conductive materials 109A and 109D, respectively.

As identified in FIG. 7, the conductive electrode materials 109 may include an electrically conductive material, such as copper. Other electrically conductive materials (e.g., other metals, etc.) may also be used for the conductive electrode materials 109. The insulating materials 104 may include an electrically insulative material, such as polyimide. Other electrically insulative materials (e.g., polymers, ceramics, oxides, etc.) may be used for the insulating materials 104.

In some examples, as discussed above, one or both of the plates 102 and 110 may include an electroactive material. For example, the electroactive material may include an electroactive polymer ("EAP"), such as polyvinylidene difluoride ("PVDF"). In additional examples, the electroactive material may include a piezoelectric ceramic material, such as lead zirconate titanate ("PZT"). Further example electroactive materials may include dielectric elastomer materials, such as those including silicone and/or acrylic materials. The plates 102 and 110 may include ceramic fibers and/or homogeneous ceramic plates. In some examples, the electroactive material may include a relaxor ferroelectric material, which may be a piezoelectric single-crystal material, such as a lead magnesium niobate-lead titanate ("PMN-PT") solid solution. In some embodiments, each of the plates 102 and 110 may have a thickness of about 150 μm or less (e.g., about 120 μm). As shown in FIG. 7 by way of example and not limitation, an overall thickness T of the device 100 may be about 0.29 mm or less, such as to provide the device 100 with sufficient flexibility to conform to a user's body part without damage or loss of functionality.

In some examples, a "blocking force" of the device 100 may refer to a theoretical maximum force generated by the device 100 when actuated. The blocking force may be achieved or estimated when the displacement of the actuator is considered to be completely blocked, such as by a theoretical load with an infinitely high stiffness. The blocking force may be measured or estimated by mounting the device 100 in a cantilever fashion and actuating (i.e., causing displacement in) the device 100 without a load, and then applying a load to force the device 100 to its initial position with an increasing load, until a maximum load is observed. This maximum load may be considered the blocking force of the device 100. In some embodiments, the blocking force of the device 100 may be between about 0.1 gram and about 100 grams. By way of non-limiting example, a blocking force of the device 100 that includes an EAP material in the plate(s) 102, 110 may be between about 0.1 gram and about 10 grams, such as about 1 gram. In additional non-limiting examples in which the device 100 includes a piezoelectric ceramic material or a relaxor ferroelectric material, the blocking force of the device 100 may be between about 1 gram and about 100 grams or higher.

In some examples, the plates 102 and 110 may be configured to be electrically activated and driven (e.g., by application of a voltage via conductive electrode materials 109) by a maximum alternating current voltage of about 250 V. A maximum equivalent series resistance of each of the plates 102 and 110 may be about 150 ohms or less. Each of the plates 102 and 110 may have a maximum capacitance of about 200 nF or less. A minimum direct current impedance of each of the plates 102 and 110 may be about 10 mega ohms or less. The values given above for the electrical properties are example values, and the plates 102 and 110 may be configured and/or selected to exhibit other electrical properties as desired, such as to induce higher or lower mechanical vibrations upon activation.

The device 100 may be capable of conforming to one or more features of a human body, such as, but not limited to, a human finger, hand, wrist, arm, head, torso, foot, or leg. The device 100 may also be capable of a relatively high mechanical output represented by a first bending mode maximum strain due to the piezoelectric coefficient of the material(s) used.

In unimorph constructions, one or more of the materials shown in FIG. 7 and/or features shown in FIGS. 4 and 6 may be omitted, since the electrically passive material (in place of the bottom plate 110) may not be activated and no voltage may be applied thereto. For example, if the bottom plate 110 is an electrically passive material, then the first and second conductive electrode materials 109A and 109B may be omitted along with their corresponding conductive terminals 108. In some examples, one or more of the bottom insulating material 104A, first and second conductive electroactive materials 109A and 109B, and/or central insulating material 104B may be replaced by the electrically passive material. In additional examples, one or more of the bottom insulating material 104A, first and second conductive electroactive materials 109A and 109B, central insulating material 104B, and/or bottom plate 110 may be replaced by a flexible electrically passive material, such as by a flexible polymer material, a textile material, and/or a foam material. Alternatively or additionally, the device 100 may be coupled to a flexible material, such as for integration into a wearable article (e.g., a glove, a shirt, a bracelet, a headband, etc.).

FIG. 8 is a top plan view of a vibrotactile device 200 (also referred to as "device 200" for simplicity) according to another embodiment of the present disclosure. The device 200 may be similar in some respects to the device 100 shown in FIGS. 4-7 and discussed above. For example, the device 200 may include a top plate 202 (e.g., a top electroactive material 202), a dielectric support material 204, holes 206 through at least the dielectric support material 204, conductive terminals 208 providing respective electrical access to conductive electrode materials 209A, 209B, 209C, and 209D, a bottom plate (not shown in the view of FIG. 8), and rounded corners 214. However, the device 200 may differ from the device 100 described above in that the top plate 202 and/or bottom plate may include a plurality of parallel strips 202A, 202B, ... 202N of electroactive material arranged adjacent to each other. The strips 202A, 202B, ... 202N of electroactive material may be configured to bend, and therefore vibrate, along their length. In some examples, providing the top plate 202 and/or bottom plate in the form of strips 202A, 202B, ... 202N of electroactive material may increase flexibility of the device 200 while maintaining a desired mechanical output.

FIG. 9 is a top plan view of a vibrotactile device 300 (also referred to as "device 300" for simplicity) according to another embodiment of the present disclosure. The device 300 may be similar in some respects to the device 100 shown in FIGS. 4-7 and discussed above. For example, the device 300 may include a top electroactive material 302, a dielectric support material 304, holes 306 through at least the dielectric support material 304, conductive terminals 308 providing respective electrical access to conductive electrode materials 309, a bottom electroactive material (not shown in the view of FIG. 9), and rounded corners 314. However, the device 300 may differ from the device 100 described above in that the top electroactive material 302 and/or bottom electroactive material may be in the form of an array of a plurality of separate and independently operated electroactive materials 302A, 302B, ... 302N. Additional conductive electrode materials 309 and conductive terminals 308 may be provided to independently apply voltages across the respective electroactive materials 302A, 302B, ... 302N for independent activation.

The device 300 may be configured to provide a pixelated vibration signal to the user. In some examples, the electroactive materials 302A, 302B, ... 302N may be individually activated to provide a vibration to a particular portion of the user's body part, or to different adjacent body parts of the user. In some examples, one or more of the electroactive materials 302A, 302B, ... 302N may be activated to provide a relatively low level of vibration and a greater number of the electroactive materials 302A, 302B, ... 302N may be activated to provide a relatively high level of vibration. In additional examples, the electroactive materials 302A, 302B, ... 302N may be activated in a particular sequence to provide certain sensations to the user, such as a wavelike sensation, an expanding sensation, a shrinking sensation, a circular sensation, or a back-and-forth sensation.

FIG. 9 illustrates the device 300 with eight electroactive materials 302A, 302B, ... 302N, but embodiments of the present disclosure including an array of electroactive materials 302A, 302B, ... 302N are not limited to a quantity of eight independently operated electroactive materials 302A, 302B, ... 302N. Rather, an array may include any suitable number of independently operated electroactive materials 302A, 302B, ... 302N, such as an array of two, three, four, eight, twelve, sixteen, twenty, twenty-five, thirty, thirty-six, sixty-four, one hundred, or more electroactive materials 302A, 302B, ... 302N.

By way of example and not limitation, FIG. 10 illustrates a vibrotactile device 400 (also referred to for simplicity as "device 400") similar to the device 300 of FIG. 9, but with sixteen electroactive materials 402A, 402B, ... 402N. For example, the device 400 of FIG. 10 may include a top electroactive material 402, a dielectric support material 404, holes 406 through at least the dielectric support material 404, conductive terminals 408 providing respective electrical access to conductive electrode materials 409, a bottom electroactive material (not shown in the view of FIG. 10), and rounded corners 414. In some examples, the device 400 may include an increased number of conductive electrode materials 409 corresponding to the number of electroactive materials 402A, 402B, ... 402N for individually selecting and operating the electroactive materials 402A, 402B, ... 402N.

In additional examples, a lower number (compared to the number of electroactive materials 402A, 402B, ... 402N) of conductive electrode materials 409 may be employed to individually select and operate the electroactive materials 402A, 402B, ... 402N. For example, a first portion of the conductive electrode materials 409 may be used to select a column location of a desired one of the electroactive materials 402A, 402B, ... 402N and a second portion of the conductive electrode materials 409 may be used to select a row location of the desired one of the electroactive materials 402A, 402B, ... 402N.

Although the devices 100, 200, 300, and 400 in FIGS. 4-10 are illustrated as generally planar, the present disclosure is not so limited and vibrotactile devices may be formed in a variety of shapes and physical configurations. For example, as illustrated in FIG. 11, a vibrotactile device 500 (also referred to as "device 500" for simplicity) may be generally circular in cross-section. The device 500 may include a plurality of individually operated electroactive materials 502A, 502B, ... 502N positioned around a circumference of the device 500. By way of example and not limitation, the circular device 500 may be incorporated in a wearable article, such as a ring, a finger portion of a glove, a bracelet, a sleeve, a necklace, a pant leg, a sock, or any other generally circular wearable article. The electroactive materials 502A, 502B, ... 502N may be operated in sequence to induce a spinning sensation around the device 500, simultaneously to vibrate together, and/or in any other suitable pattern to provide a variety of haptic sensations to the user. In addition, although eight electroactive materials 502A, 502B, ... 502N are illustrated in FIG. 11, additional embodiments may include any desired number of electroactive materials 502A, 502B, ... 502N, such as one, two, three, four, ten, sixteen, twenty, etc.

Figure 12:
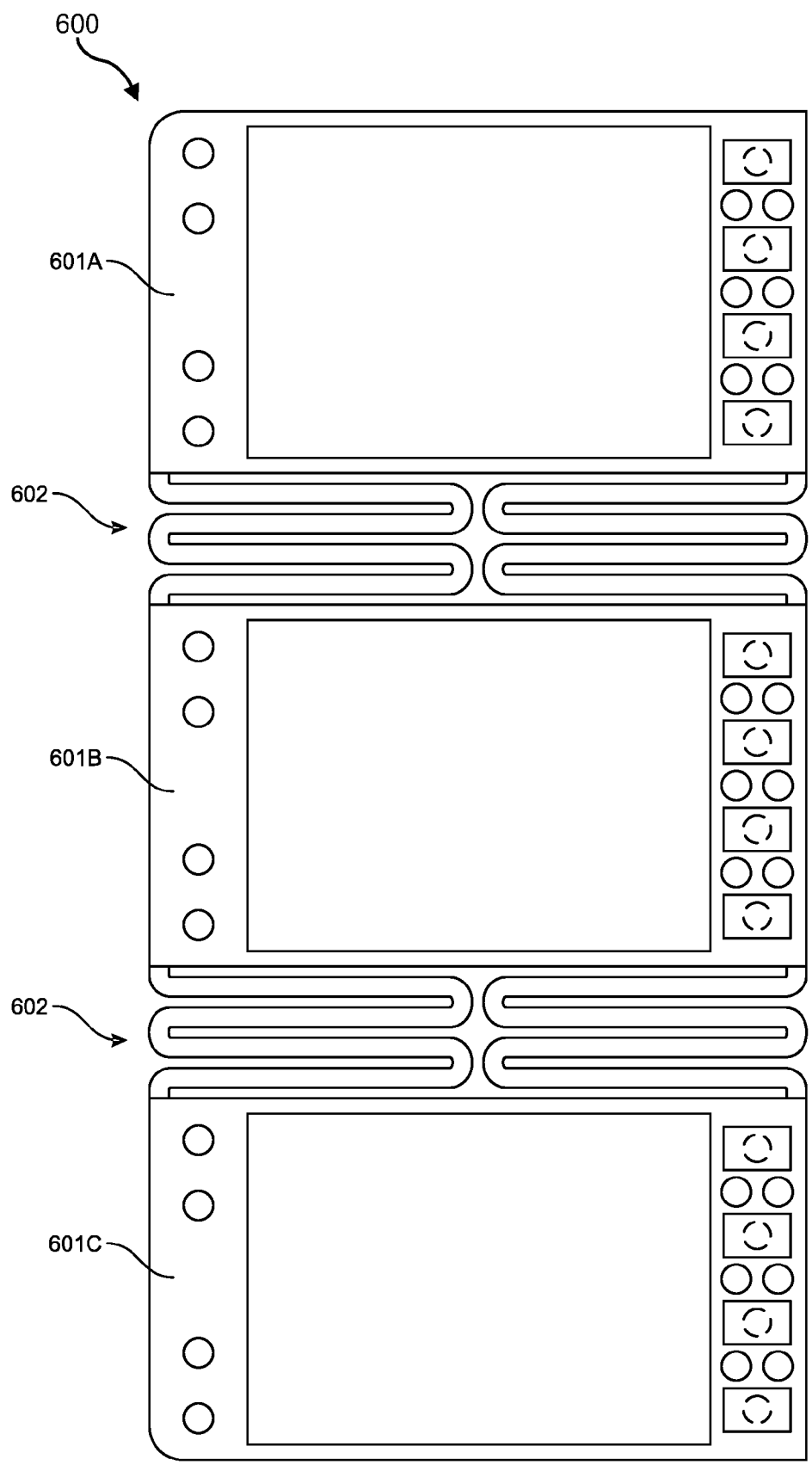
FIG. 12 is a top plan view of a vibrotactile device according to a further embodiment of the present disclosure.

FIG. 12 illustrates a top plan view of a vibrotactile device 600 (also referred to as "device 600" for simplicity) according to additional embodiments of the present disclosure. The device 600 may include multiple adjacent vibrotactors 601A, 601B, 601C that are coupled to each other in a side-by-side arrangement via respective flexible connectors 602. Each of the vibrotactors 601A, 601B, 601C may be or include one or more of the vibrotactile devices 100, 200, 300, 400, and/or 500 described above and shown in FIGS. 4-11. Each of the flexible connectors 602 may follow a tortuous path to increase a flexibility thereof, as shown in FIG. 12. However, in additional embodiments, the flexible connectors 602 may have other suitable shapes and configurations, such as straight, zig-zag, angled (relative to one or more sides of the vibrotactors 601A, 601B, 601C), etc.

The device 600 may be a flexible array of vibrotactors 601A, 601B, 601C for use in applications where multiple vibrotactors 601A, 601B, 601C are desired and bending may be expected or desired. For example, the device 600 may be implemented in a finger portion of a glove (e.g., the glove 10 shown in FIG. 1) with the vibrotactors 601A, 601B, and 601C respectively positioned in intended locations of a user's finger tip portion, middle portion, and base portion. In this example, the flexible connectors 602 may be respectively positioned in intended locations of the user's finger joints. In additional examples, the device 600 may be implemented in another wearable article, such as a sleeve, pant leg, ring, bracelet, necklace, headband, sock, etc.

In addition, the device 600 may advantageously facilitate the fabrication and electrical characteristics of an array of vibrotactors. For example, substrates of the vibrotactors 601A, 601B, 601C may be implemented as common ground plates, which may be electrically connected to each other through the flexible connectors 602, to simplify electrical wiring and activation of the vibrotactors 601A, 601B, 601C (compared to embodiments in which each of the vibrotactors 601A, 601B, 601C is implemented with its own respective ground plate).

Figure 13:
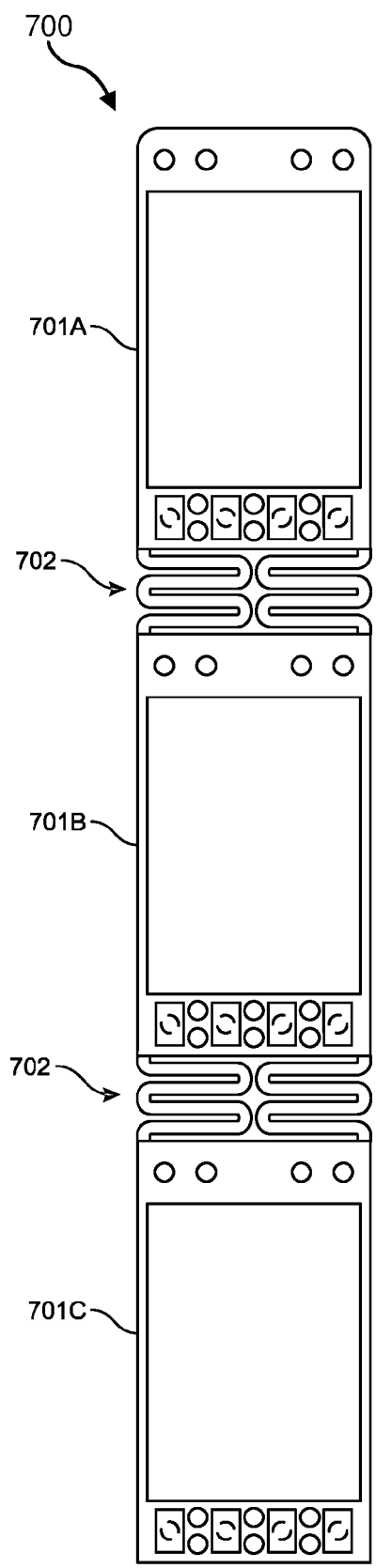
FIG. 13 is a top plan view of a vibrotactile device according to another embodiment of the present disclosure.

FIG. 13 illustrates a vibrotactile device 700 (also referred to as "device 700" for simplicity) similar to the device 600 described above and shown in FIG. 12. For example, the device 700 may include multiple vibrotactors 701A, 701B, 701C that are coupled to each other via respective flexible connectors 702. However, as shown in FIG. 13, the vibrotactors 701A, 701B, 701C of the device 700 may be coupled to each other in an end-to-end arrangement, rather than the side-by-side arrangement of the device 600 of FIG. 12.

Figure 14:
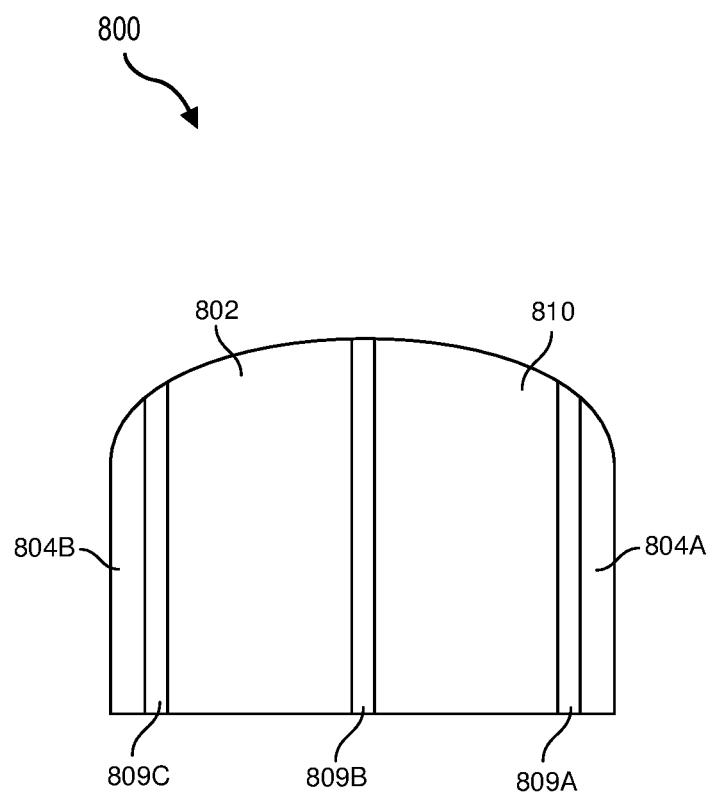
FIG. 14 is a partial cross-sectional view of a portion of a vibrotactile device according to an embodiment of the present disclosure.

FIG. 14 is a partial cross-sectional view of a portion of a vibrotactile device 800 (also referred to as "device 800" for simplicity) according to another embodiment of the present disclosure. The device 800 may be similar in some respects to the device 100 shown in FIG. 7 and discussed above. For example, the device 800 may include a top plate 802 (e.g., a top electroactive material 802) and a bottom plate 810 (e.g., a bottom electroactive material 810). A first conductive electrode material 809A and a second conductive electrode material 809B may be positioned on opposite sides of the bottom plate 810. The device 800 may also include a bottom insulating material 804A and a top insulating material 804B to provide a protective coating to the device 800. However, the device 800 may lack a central insulating material. Rather, the second conductive electrode material 809B may act as a common (e.g., grounded) electrode for applying a voltage across both the bottom plate 810 and the top plate 802. Thus, to activate (e.g., vibrate) the bottom plate 810, a voltage may be applied between the first and second conductive electrode materials 809A and 809B. To activate (e.g., vibrate) the top plate 802, a voltage may be applied between the second conductive electrode material 809B and a third conductive electrode material 809C positioned on an opposite side of the top plate 802. In this case, the device 800 may include three conductive terminals to respectively provide electrical communication to the three conductive electrode materials 809A, 809B, and 809C.

Figure 15:
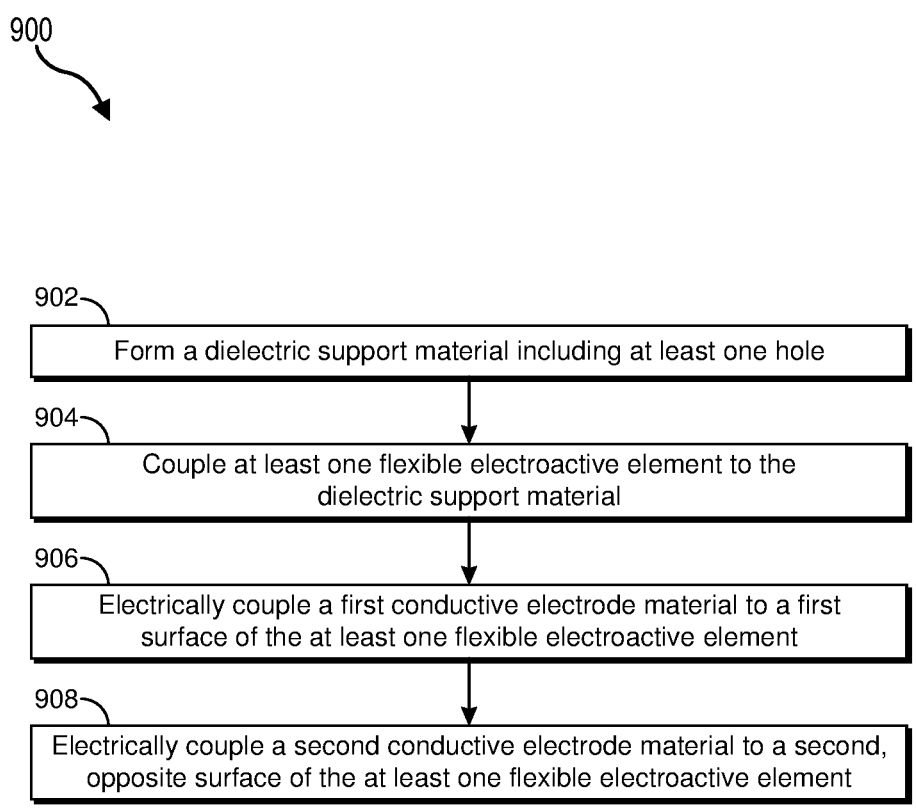
FIG. 15 is a flow diagram illustrating a method of forming a flexible vibrotactile device according to embodiments of the present disclosure.

FIG. 15 is a flow diagram illustrating a method 900 of forming a flexible vibrotactile device according to embodiments of the present disclosure. In operation 902, a dielectric support material may be formed to include one hole therethrough. Operation 902 may be performed in a variety of ways. The dielectric support material may be a flexible electrically insulating material, such as a polymer, a ceramic material, an oxide material, a textile material, etc. The dielectric support material may be selected to have desired properties, such as sufficient flexibility, mechanical stiffness, compatibility with other materials and components of the vibrotactile device, etc. The hole(s) in the dielectric support material may be formed by, for example, stamping, punching, molding, or drilling.

In operation 904, at least one flexible electroactive element may be coupled to the dielectric support material. Operation 904 may be performed in a variety of ways. For example, a material of the electroactive element may be or include an electroactive polymer, a piezoelectric ceramic material, or a piezoelectric single-crystal material. Coupling the electroactive element to the dielectric support material may be accomplished by forming the material of the electroactive element directly on the dielectric support material, or by forming the electroactive element separately and connecting the electroactive element to the dielectric support material.

In operation 906, a first conductive electrode material may be electrically coupled to a first surface of the at least one flexible electroactive element. Operation 906 may be performed in a variety of ways. The first conductive electrode material may be or include an electrically conductive material, such as a metal (e.g., copper). Electrically coupling the first conductive electrode material to the first surface of the flexible electroactive element may be accomplished by forming the first conductive electrode material on the first surface, or by forming the first conductive electrode material separately and connecting the first conductive electrode material to the first surface.

In operation 908, a second conductive electrode material may be electrically coupled to a second, opposite surface of the at least one flexible electroactive element. Operation 908 may be performed in a variety of ways. The second conductive electrode material may be or include an electrically conductive material, such as a metal (e.g., copper). Electrically coupling the second conductive electrode material to the first surface of the flexible electroactive element may be accomplished by forming the second conductive electrode material on the second surface, or by forming the second conductive electrode material separately and connecting the second conductive electrode material to the second surface.

The materials and components of the vibrotactile device may be formed to have thicknesses and material properties that enable the vibrotactile device, when fully assembled, to be sufficiently flexible for bending and placing against a body part of a user. For example, the vibrotactile device may be sufficiently flexible to be bent and placed against a finger, hand, wrist, arm, head, torso, foot, or leg of a user without damage or reduced functionality.

Accordingly, disclosed are flexible vibrotactile devices, systems, and methods that may improve integration of the vibrotactile devices in wearable devices and systems. The flexible vibrotactile devices may include features, such as holes and/or rounded corners, to facilitate integration in wearable systems and textiles, for example. Additionally, the configuration and materials used for the vibrotactile devices of the present disclosure may improve flexibility of the devices while maintaining a desired mechanical response (e.g., level of vibration).

Embodiments of the present disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more users.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A flexible vibrotactile device, comprising:
   a dielectric support material including at least one hole therethrough for securing the flexible vibrotactile device to a textile by threading at least one fiber through the at least one hole;
   at least one flexible electroactive element coupled to the dielectric support material and comprising a first flexible electroactive element and a second flexible electroactive element;
   a first conductive electrode material positioned adjacent to and in electrical contact with the first flexible electroactive element; and
   a second conductive electrode material positioned adjacent to and in electrical contact with the second flexible electroactive element opposite the first flexible electroactive element, wherein the first conductive electrode material is configured to apply a first voltage across the first flexible electroactive element, and the second conductive electrode material is configured to apply a second voltage across the second flexible electroactive element, wherein the second voltage is 180-degree phase shifted from the first voltage to induce movement in the at least one flexible electroactive element.

2. The flexible vibrotactile device of claim 1, wherein the first flexible electroactive element and the second flexible electroactive element together define a bimorph structure.

3. The flexible vibrotactile device of claim 2, wherein:
   the first conductive electrode material is positioned adjacent to a first side of the first flexible electroactive element;
   the second conductive electrode material comprises a common electrode positioned adjacent to a second, opposite side of the first flexible electroactive element and between the first flexible electroactive element and the second flexible electroactive element; and
   the flexible vibrotactile device further comprises a third conductive electrode material positioned adjacent to a side of the second flexible electroactive element opposite the second conductive electrode material and opposite the first flexible electroactive element.

4. The flexible vibrotactile device of claim 2, wherein:
   the first conductive electrode material is positioned adjacent to a first side of the first flexible electroactive element;
   the second conductive electrode material is positioned adjacent to a second, opposite side of the first flexible electroactive element and between the first flexible electroactive element and the second flexible electroactive element; and
   the flexible vibrotactile device further comprises:
   a third conductive electrode material positioned adjacent to a first side of the second flexible electroactive element and between the first flexible electroactive element and the second flexible electroactive element;
   a fourth conductive electrode material positioned adjacent to a second, opposite side of the second flexible electroactive element; and
   a central insulating material positioned between the second conductive electrode material and the third conductive electrode material.

5. The flexible vibrotactile device of claim 2, further comprising:
   a first insulating material positioned over the first conductive electrode material to provide a protective coating over the first conductive electrode material; and
   a second insulating material positioned over the second conductive electrode material to provide a protective coating over the second conductive electrode material.

6. The flexible vibrotactile device of claim 2, wherein each of the first flexible electroactive element and the second flexible electroactive element has a thickness of about 150 μm or less.

7. The flexible vibrotactile device of claim 1, wherein the at least one flexible electroactive element comprises at least one of:
   an electroactive polymer material;
   a dielectric elastomer material;
   a relaxor ferroelectric material;
   a piezoelectric ceramic material; or
   a piezoelectric single-crystal material.

8. The flexible vibrotactile device of claim 1, wherein the at least one flexible electroactive element comprises lead zirconate titanate (PZT).

9. The flexible vibrotactile device of claim 1, wherein at least one flexible electroactive element comprises lead magnesium niobite-lead titanate (PMN-PT).

10. The flexible vibrotactile device of claim 1, wherein each of the first conductive electrode material and the second conductive electrode material comprises copper.

11. The flexible vibrotactile device of claim 1, wherein each of the first flexible electroactive element and the second flexible electroactive element comprises a plurality of strips of flexible electroactive material positioned adjacent to and parallel to each other.

12. The flexible vibrotactile device of claim 1, wherein the dielectric support material has a rectangular shape with at least two rounded corners to facilitate positioning at least a portion of the flexible vibrotactile device within a pocket of the textile.

13. The flexible vibrotactile device of claim 1, wherein the at least one hole through the dielectric support material comprise:
   at least one upper hole through an upper portion of the dielectric support material; and
   at least one lower hole through a lower portion of the dielectric support material on an opposite side of the at least one flexible electroactive element from the at least one upper hole.

14. The flexible vibrotactile device of claim 1, further comprising:
   a first conductive terminal for providing electrical access to the first conductive electrode material; and
   a second conductive terminal for providing electrical access to the second conductive electrode material.

15. The flexible vibrotactile device of claim 1, wherein the flexible vibrotactile device has a thickness of about 0.29 mm or less.

16. A vibrotactile system, comprising:
  a flexible wearable textile material shaped and configured for positioning against a body part of a user of the vibrotactile system, wherein the flexible wearable textile material includes at least one pocket;
  a flexible vibrotactile device coupled to the flexible wearable textile material and positioned at least partially within the at least one pocket to apply a vibration to the body part of the user when in use, wherein the flexible vibrotactile device comprises:
    a dielectric support material including at least one hole therethrough, wherein the flexible vibrotactile device is secured to the flexible wearable textile material via a fiber threaded through the at least one hole;
    at least one flexible electroactive element coupled to the dielectric support material and comprising a first flexible electroactive element and a second flexible electroactive element; and
    a first conductive electrode material positioned adjacent to the first flexible electroactive element and a second conductive electrode material positioned adjacent to the second flexible electroactive element, wherein the first conductive electrode material configured to apply a first voltage across the first flexible electroactive element and the second conductive electrode material is configured to apply a second voltage across the second flexible electroactive element, wherein the second voltage is 180-degree phase shifted from the first voltage to induce movement in the at least one flexible electroactive element;
  a power source electrically coupled to at least one of the first conductive electrode material or the second conductive electrode material to apply the first voltage and the second voltage; and
  a communications interface in electrical communication with the power source to direct application of the first voltage and the second voltage across the at least one flexible electroactive element upon receipt of an activation signal through the communications interface.

17. The vibrotactile system of claim 16, wherein the flexible wearable textile material comprises at least one of:
  a glove;
  a headband;
  a wristband;
  an armband;
  a sleeve;
  a head covering;
  a sock;
  a shirt; or
  pants.

18. The vibrotactile system of claim 16, wherein the first flexible electroactive element and the second flexible electroactive element comprise an array of flexible electroactive elements positioned to apply vibrations to different respective portions of the body part of the user of the vibrotactile system.

19. The vibrotactile system of claim 16, further comprising another flexible vibrotactile device coupled to the flexible wearable textile material in a location to apply a vibration to another body part of the user of the vibrotactile system that is different from the body part associated with the flexible vibrotactile device.

20. A method of forming a flexible vibrotactile device, comprising:
  forming a dielectric support material to include at least one hole therethrough for securing the flexible vibrotactile device to a textile by threading at least one fiber through the at least one hole;
  coupling at least one flexible electroactive element to the dielectric support material, wherein the at least one flexible electroactive element comprises a first flexible electroactive element and a second flexible electroactive element;
  electrically coupling a first conductive electrode material to the first flexible electroactive element; and
  electrically coupling a second conductive electrode material to the second flexible electroactive element to enable application of a first voltage across the first flexible electroactive element via the first conductive electrode material and to enable application of a second voltage across the second flexible electroactive element via the second conductive electrode material, wherein the second voltage is 180-degree phase shifted from the first voltage.

* * * * *